(12) United States Patent
Kandel et al.

(10) Patent No.: US 12,354,952 B2
(45) Date of Patent: Jul. 8, 2025

(54) INTEGRATED CIRCUITS (ICS) EMPLOYING MULTI-PATTERN METALLIZATION TO OPTIMIZE METAL INTERCONNECT SPACING FOR IMPROVED PERFORMANCE AND RELATED FABRICATION METHODS

(71) Applicant: QUALCOMM Incorporated, San Diego, CA (US)

(72) Inventors: Bed Raj Kandel, San Diego, CA (US); Katherine Zhang, San Diego, CA (US); Thomas Hua-Min Williams, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 475 days.

(21) Appl. No.: 17/659,214

(22) Filed: Apr. 14, 2022

(65) Prior Publication Data

US 2023/0335489 A1 Oct. 19, 2023

(51) Int. Cl.
*H01L 23/528* (2006.01)
*H01L 21/768* (2006.01)
*H01L 23/522* (2006.01)

(52) U.S. Cl.
CPC ...... *H01L 23/528* (2013.01); *H01L 21/76816* (2013.01); *H01L 21/76877* (2013.01); *H01L 23/5226* (2013.01)

(58) Field of Classification Search
CPC .................................................. H01L 23/528
See application file for complete search history.

(56) References Cited

U.S. PATENT DOCUMENTS

| 2015/0332962 | A1 | 11/2015 | Chen et al. |
| 2017/0317027 | A1 | 11/2017 | Chen et al. |
| 2019/0393318 | A1 | 12/2019 | Chung et al. |
| 2020/0343359 | A1* | 10/2020 | Liaw ................ H01L 29/66545 |

FOREIGN PATENT DOCUMENTS

EP  3073528 A1 * 9/2016 ......... H01L 21/8238

OTHER PUBLICATIONS

International Search Report and Written Opinion for International Patent Application No. PCT/US2023/063213, mailed Jun. 23, 2023, 12 pages.

* cited by examiner

Primary Examiner — Yu-Hsi D Sun
(74) Attorney, Agent, or Firm — W&T/Qualcomm Incorporated

(57) ABSTRACT

An integrated circuit (IC) includes transistors formed in diffusion regions. In each transistor, a source and a drain extend in a first direction, and a gate is disposed on the diffusion region between the source and the drain. To reduce connection resistance through at least one of a source metal line and a drain metal line connected to the source and the drain of a transistor, one of the source metal line and the drain metal line extends farther than the other in the first direction to provide additional via landing area to support an interconnection via having reduced resistance without increasing side-to-side capacitance between the source and drain metal lines. Increasing the via landing area reduces connection resistance to the source and/or drain. Providing an extended source metal line and/or drain metal line allows a via landing area to be shifted in the first direction to reduce via capacitance.

17 Claims, 12 Drawing Sheets

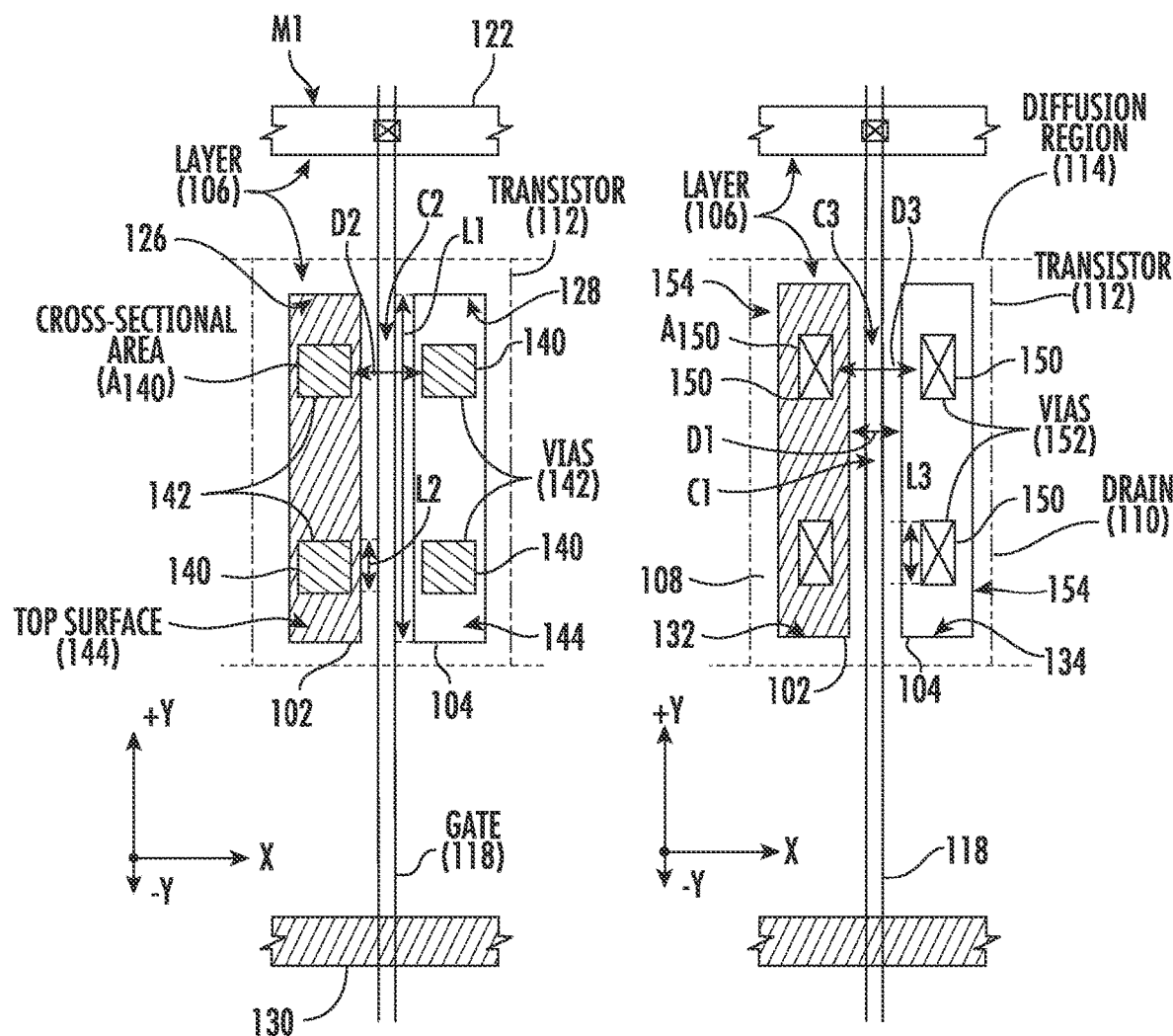

INTEGRATED CIRCUITS (ICS) EMPLOYING MULTI-PATTERN METALLIZATION TO OPTIMIZE METAL INTERCONNECT SPACING FOR IMPROVED PERFORMANCE AND RELATED FABRICATION METHODS

BACKGROUND

I. Field of the Disclosure

The technology of the disclosure relates generally to integrated circuits and, more particularly, to metal interconnects formed in a metal layer with multi-pattern metallization.

II. Background

Meeting market demand for smaller electronic devices that consume less power while providing a higher level of function (i.e., more functions at a higher level of performance) drives continuous development of new generations of integrated circuits and the semiconductor circuits therein. Semiconductor circuits include transistors formed in semiconductor material in and/or on a substrate, with the transistors electrically connected to circuits by metal interconnects formed in layers above the substrate. With each new generation of semiconductor technology, the transistors are smaller, and the metal interconnects connecting the transistors in circuits are smaller and closer together. Narrow metal interconnects providing signals or power to the transistors have caused a high connection resistance in electrical circuits, which increases power consumption and/or slows performance. Locating metal interconnects close to each other can increase circuit capacitance, which can also slow circuit performance. Thus, there is a need for ways to achieve better electrical circuit performance with existing manufacturing technologies.

SUMMARY OF THE DISCLOSURE

Aspects disclosed in the detailed description include integrated circuits (ICs) employing multi-pattern metallization to optimize metal interconnect spacing for improved performance. Related methods of manufacturing ICs with optimized metal interconnect spacing are also disclosed. The IC includes one or more transistors formed in diffusion regions. The IC includes metal lines in metal layers that are coupled to respective sources and drains of the transistors to provide signal routing and/or power to the transistors. In each transistor, a source and a drain extend in a first direction, and a gate is disposed on the diffusion region between the source and the drain. The metal lines include, in each transistor, a source metal line coupled to the source and a drain metal line coupled to the drain to provide connectivity to the source and drain of the transistor. In exemplary aspects, to reduce connection resistance through at least one of the source metal line and the drain metal line connected to the source and drain, respectively, of a transistor, one of the source metal line and the drain metal line extends farther in the first direction than the other one of the source metal line and the drain metal line. In this manner, an additional via landing area is provided to support an interconnection via of increased area for reduced resistance without increasing side-to-side capacitance between the source metal line and the drain metal line. Increasing the area of the via reduces the connection resistance to the source and/or drain. Providing an extended source metal line and/or drain metal line also allows a via landing area to be moved farther in the first direction to reduce via to via capacitance. In some examples, one of the source metal line and drain metal line extends farther in the first direction, and the other one of the drain metal line and the source metal line extends farther in an opposite direction to reduce interconnection resistance. In some examples, the source metal line and the drain metal line are formed in a same metal layer with different metallization patterns.

Exemplary aspects disclosed herein include an integrated circuit (IC), comprising a semiconductor comprising a diffusion region, and a transistor comprising a source and a drain, each disposed in the diffusion region. The IC further comprises a metal layer comprising a source metal line coupled to the source and extending in a first direction and a drain metal line coupled to the drain and extending in the first direction. A first metal line of the source metal line and the drain metal line extends farther in the first direction than a second metal line of the source metal line and the drain metal line.

In another exemplary aspect, a method of fabricating an integrated circuit is disclosed. The method comprises forming, in a diffusion region of a semiconductor, a transistor comprising a source and a drain. The method further comprises forming a metal layer comprising forming a source metal line coupled to the source and extending in a first direction. Forming the metal layer further comprises forming a drain metal line coupled to the drain and extending in the first direction. A first metal line of the source metal line and the drain metal line is formed to extend farther in the first direction than a second metal line of the source metal line and the drain metal line.

In another exemplary aspect, a transistor circuit is disclosed. The transistor circuit comprises a diffusion region, a source, and a drain, each disposed in the diffusion region. The transistor circuit further comprises a metal layer comprising a source metal line coupled to the source and extending in a first direction and a drain metal line coupled to the drain and extending in the first direction. A first metal line of the source metal line and the drain metal line extends farther in the first direction than a second metal line of the source metal line and the drain metal line.

BRIEF DESCRIPTION OF THE FIGURES

FIG. 1B is an illustration of a top view of a source metal line and a drain metal line in the IC in FIG. 1A showing via landing areas for vias on a top surface of the source and drain metal lines;

FIG. 1C is an illustration of a top view of the source and drain metal lines in FIG. 1B showing via landing areas for vias on a bottom surface of the source and drain metal lines;

Figure 3A:
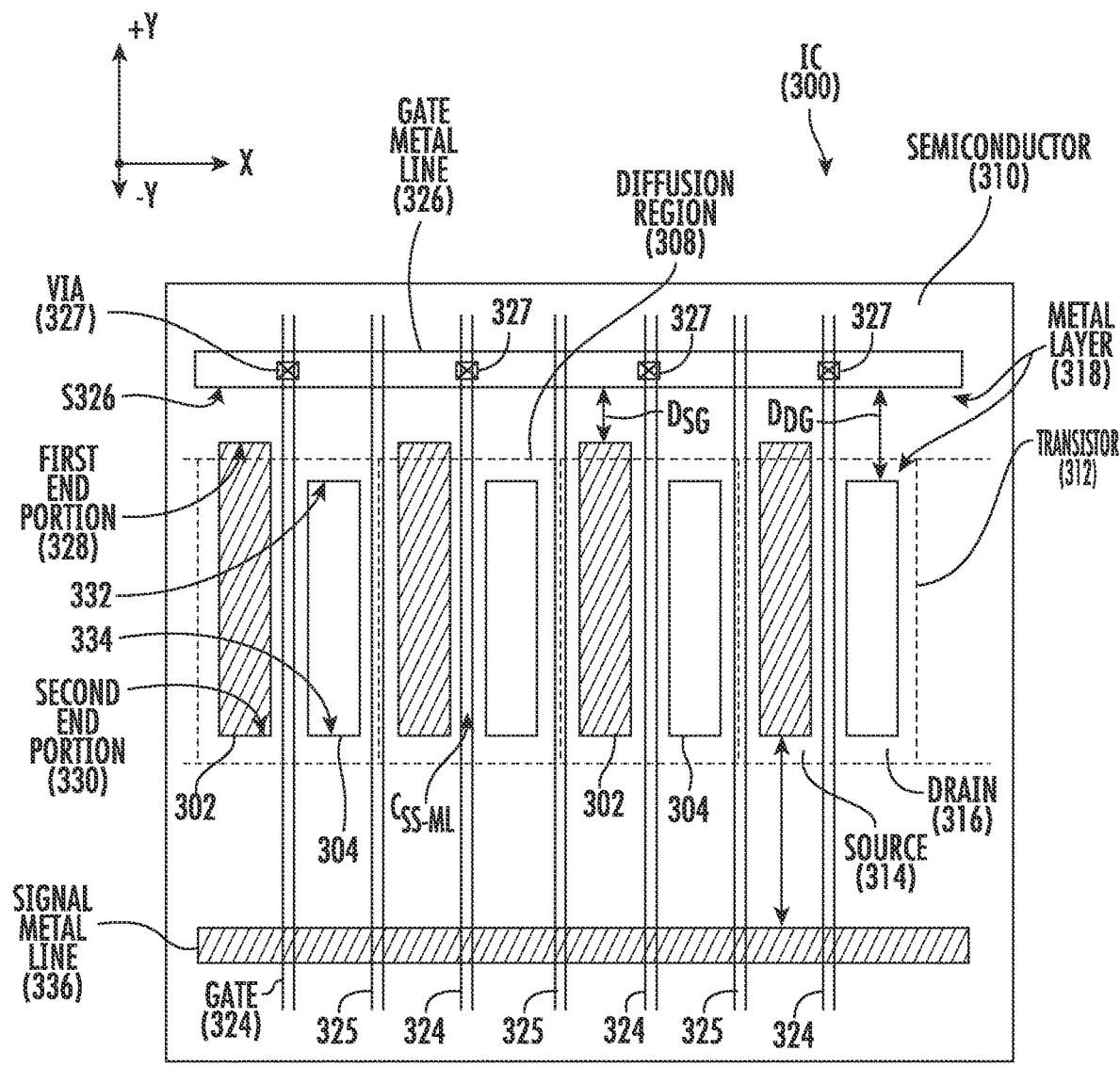
FIG. 3A is an illustration of a top view of an exemplary IC in which one of a source metal line and a drain metal line of a transistor extends farther in a direction than the other metal line to increase a via landing area for reduced interconnection resistance.
Figures 3B, 3C:
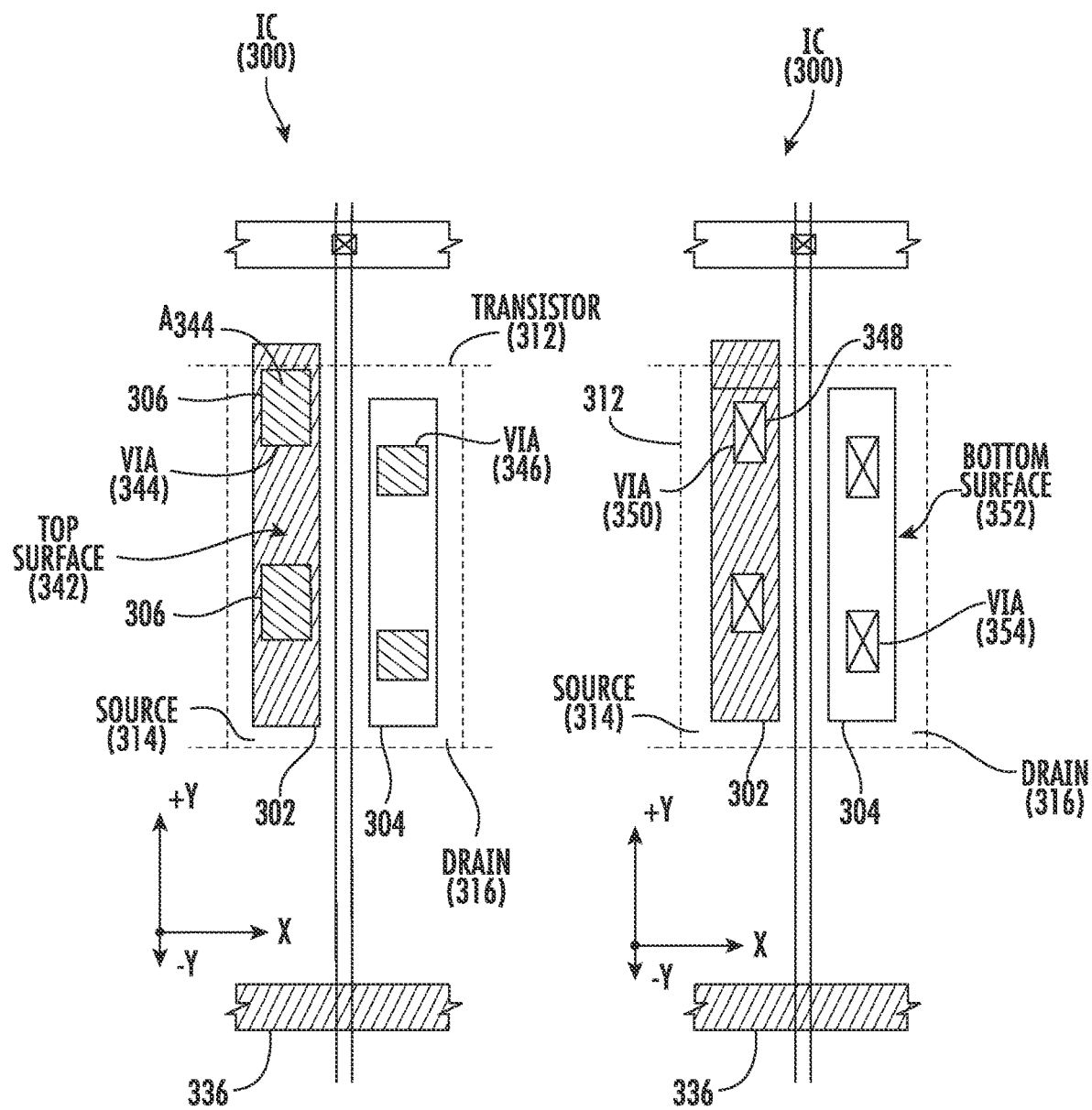
FIG. 3B is an illustration of a top view of a source metal line and a drain metal line of a transistor in the IC in FIG.
Figure 4:
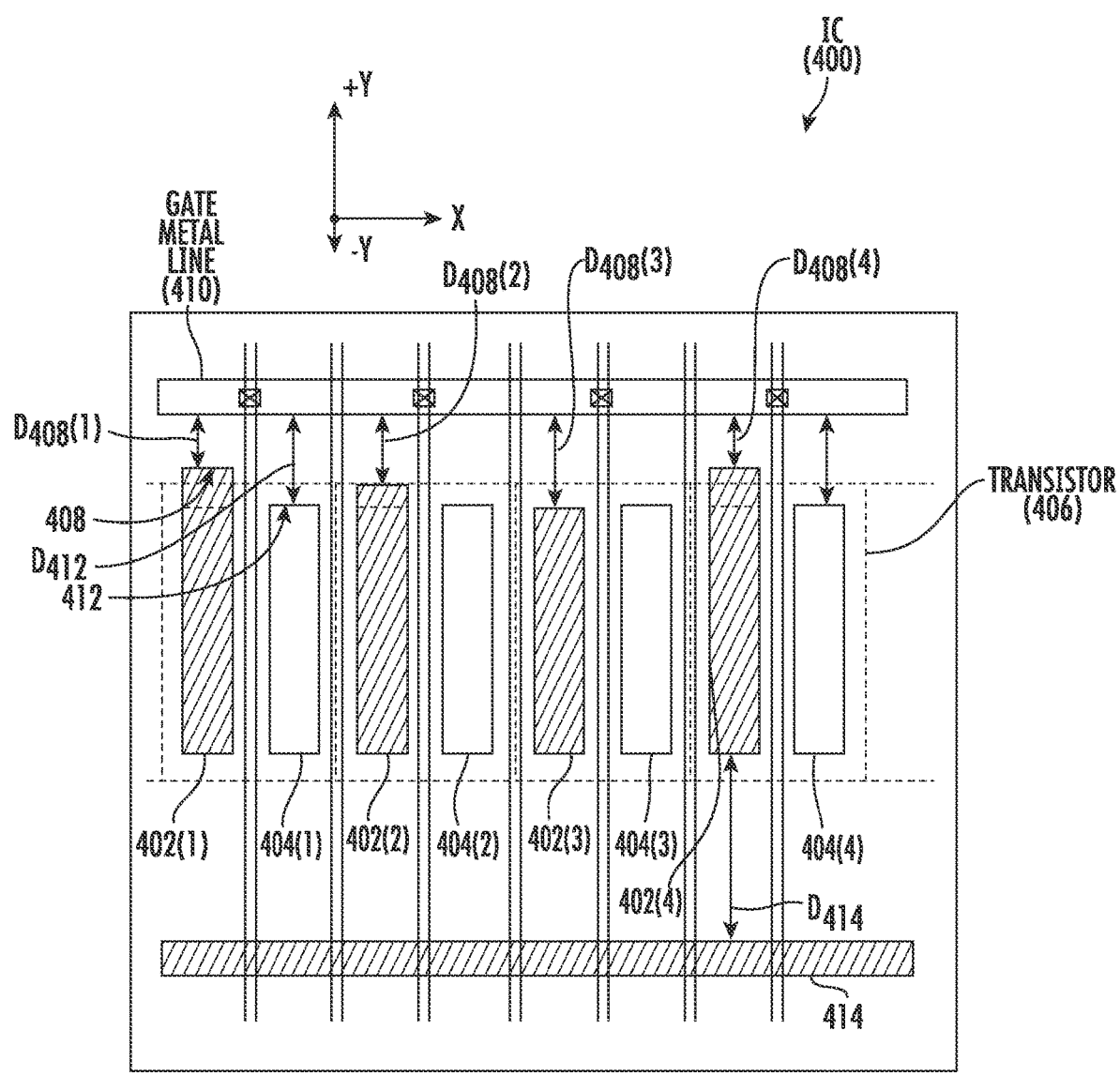
Figure 5A:
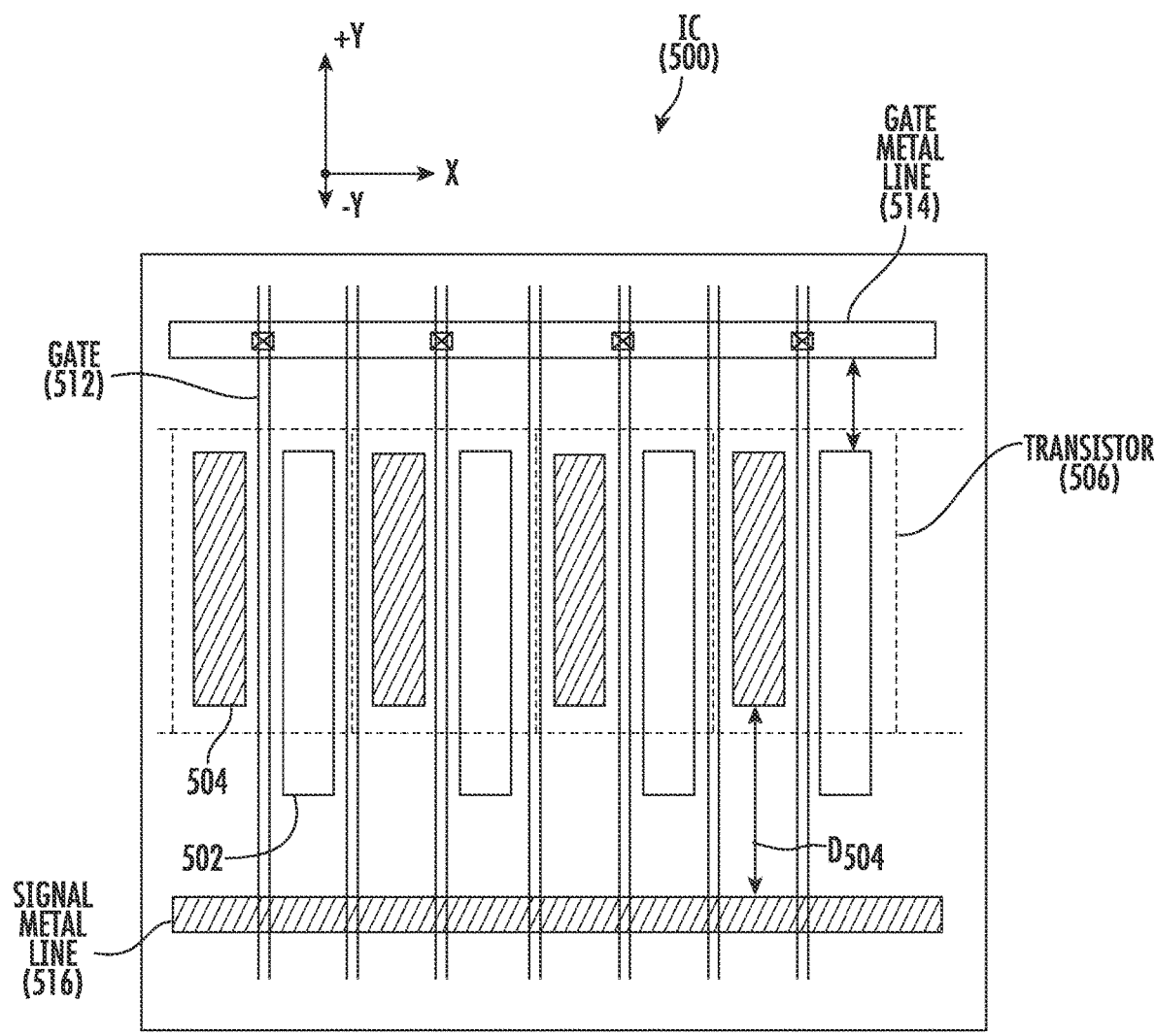
Figures 5B, 5C:
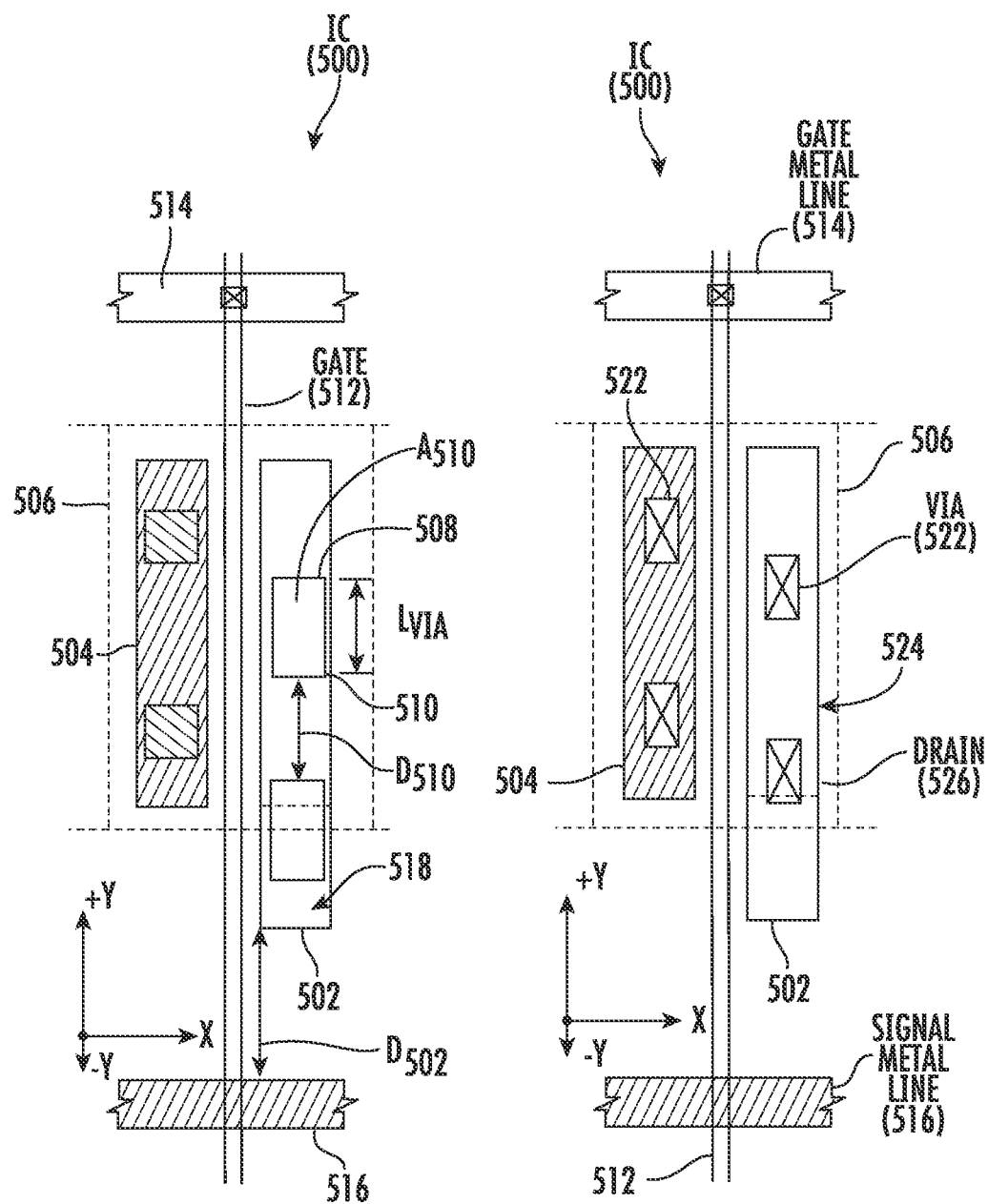
Figure 6:
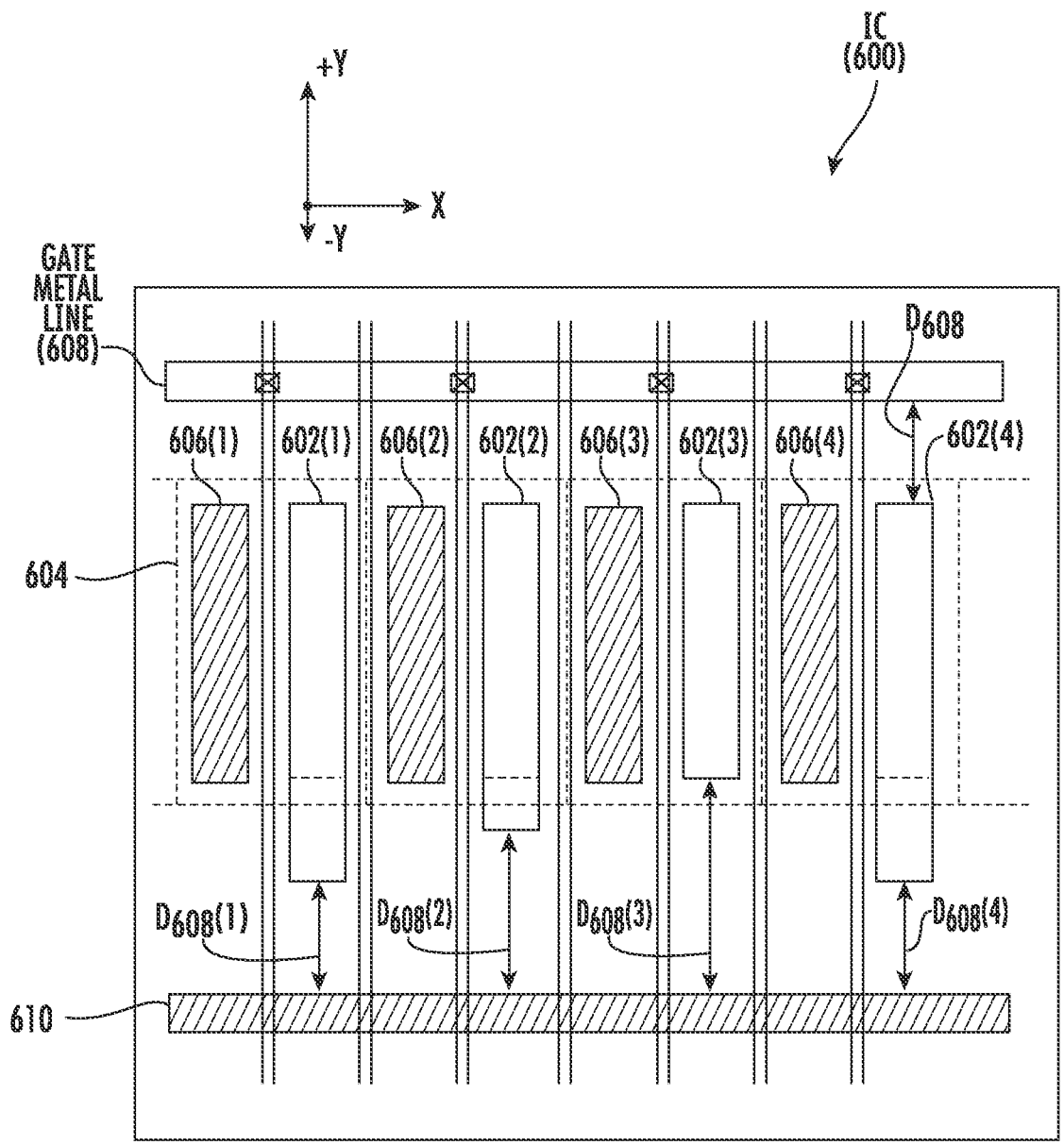
Figure 7:
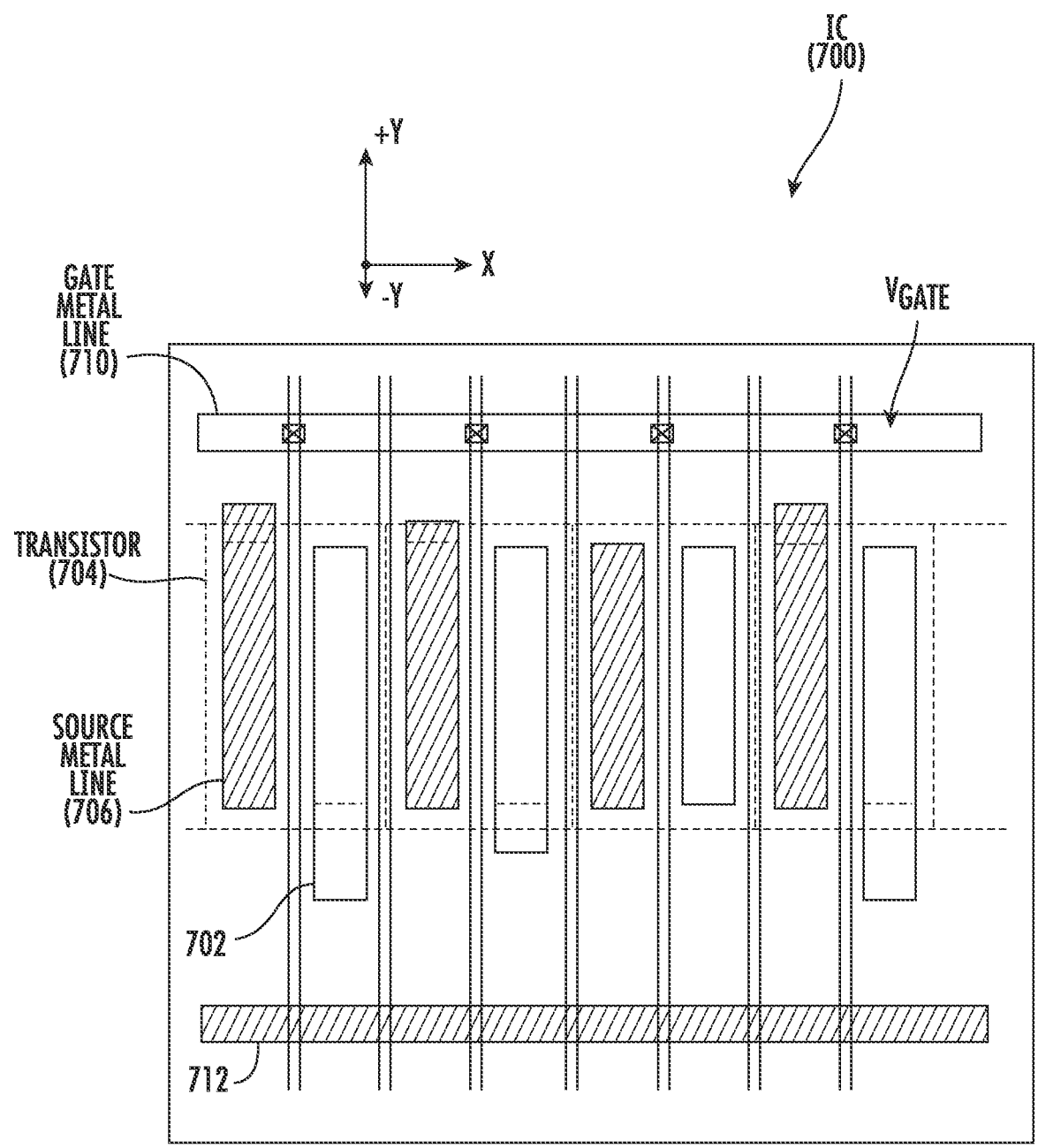
Figure 8:
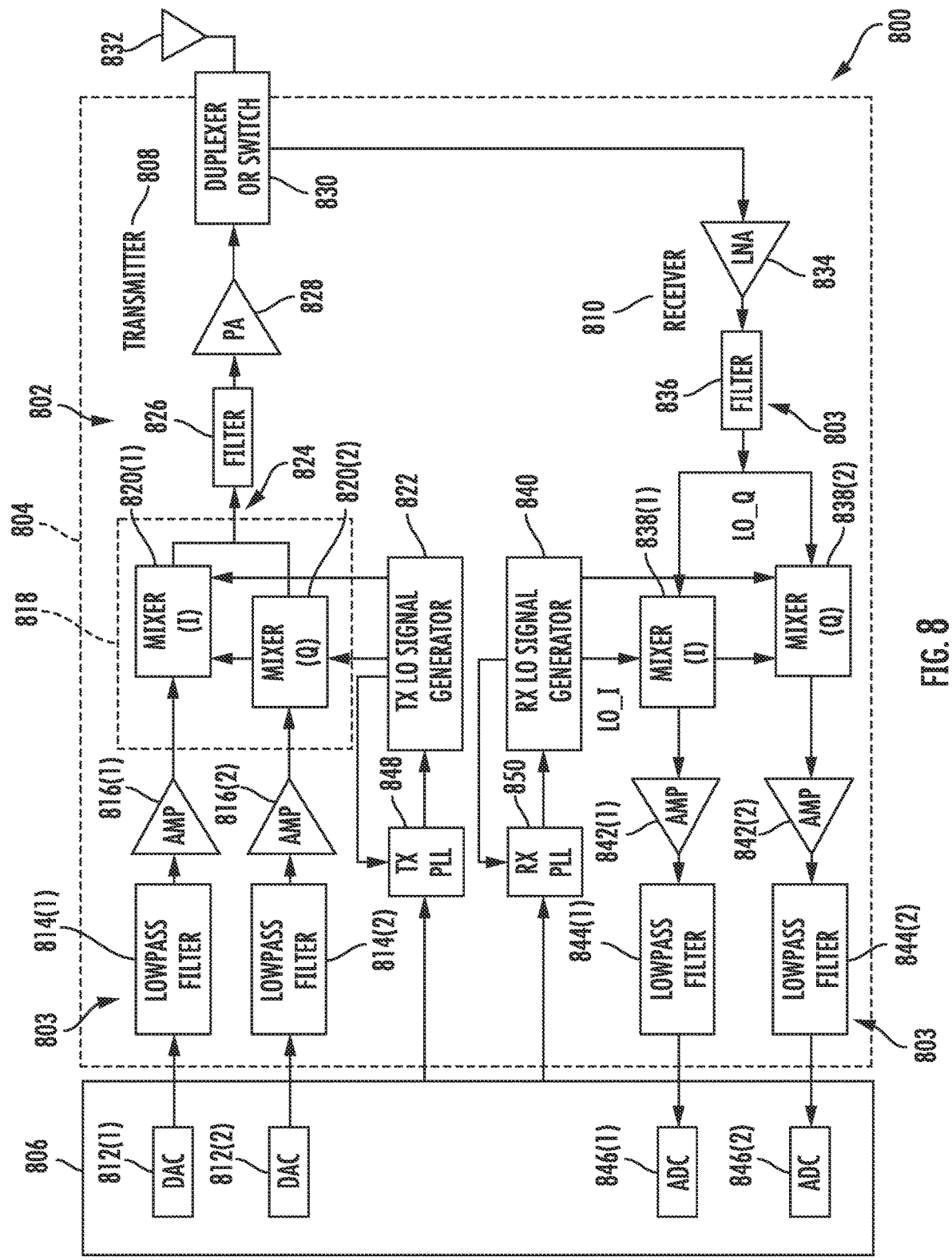
Figure 9:
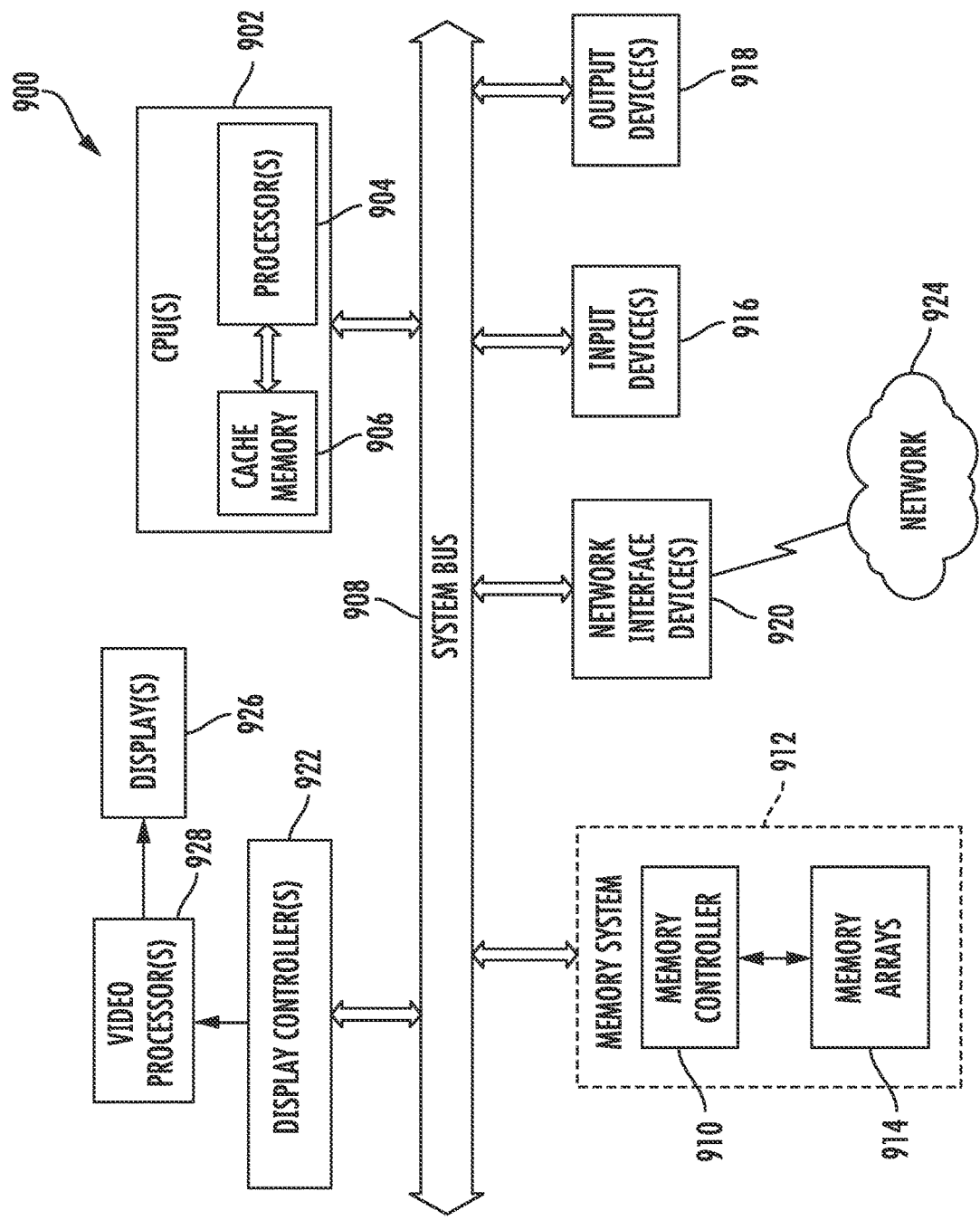

3A showing increased via landing areas for vias on a top surface of an extended one of the source and drain metal lines;

FIG. 3C is an illustration of a top view of a source metal line and a drain metal line of a transistor in the IC in FIG. 3A showing shifted via landing areas for vias on a bottom surface of an extended one of the source and drain metal lines for reduced via capacitance;

FIG. 4 is an illustration of a top view of an exemplary IC in which either source metal lines or drain metal lines of transistors extend various distances farther in a first direction to increase and shift a via landing area of at least one via;

FIG. 5A is an illustration of a top view of an exemplary IC in which either drain metal lines or source metal lines of transistors extend farther in a second direction to increase and shift a via landing area of at least one via;

FIG. 5B is an illustration of a top view of a drain metal line and a source metal line of a transistor in the IC in FIG. 5A showing increased via landing areas for vias on a top surface of an extended one of the drain and source metal lines;

FIG. 5C is an illustration of a top view of a drain metal line and a source metal line of a transistor in the IC in FIG. 5A showing via landing areas shifted in the second direction for vias on a bottom surface of an extended one of the drain and source metal lines for reduced via capacitance;

FIG. 6 is an illustration of a top view of an exemplary IC in which drain metal lines of transistors extend farther in a first direction than source metal lines by different distances to increase via landing areas of vias;

FIG. 7 is an illustration of a top view of an exemplary IC in which drain metal lines of transistors extend farther in a first direction than the source metal lines of the transistors and the source metal lines extend farther in a second direction than the drain metal lines to increase via landing area sizes to reduce resistance without increasing capacitance and shift via landing areas to reduce capacitance;

FIG. 8 is a block diagram of an exemplary wireless communications device that includes a radio-frequency integrated circuit (RFIC), including an exemplary IC in which at least one of a source metal line and a drain metal line of a transistor extends farther in a direction than the other metal line to increase a via landing area for reduced interconnection resistance, including the ICs in FIGS. 3A-7; and FIG. 9 is a block diagram of an exemplary processor-based system that can include an RFIC including an exemplary IC in which at least one of a source metal line and a drain metal line of a transistor extends farther in a direction than the other metal line to increase a via landing area for reduced interconnection resistance, including the ICs in FIGS. 3A-7.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include integrated circuits (ICs) employing multi-pattern metallization to optimize metal interconnect spacing for improved performance. Related methods of manufacturing ICs with optimized metal interconnect spacing are also disclosed. The IC includes one or more transistors formed in diffusion regions. The IC includes metal lines in metal layers that are coupled to respective sources and drains of the transistors to provide signal routing and/or power to the transistors. In each transistor, a source and a drain extend in a first direction, and a gate is disposed on the diffusion region between the source and the drain. The metal lines include, in each transistor, a source metal line coupled to the source and a drain metal line coupled to the drain to provide connectivity to the source and drain of the transistor. In exemplary aspects, to reduce connection resistance through at least one of the source metal line and the drain metal line connected to the source and drain, respectively, of a transistor, one of the source metal line and the drain metal line extends farther in the first direction than the other one of the source metal line and the drain metal line. In this manner, an additional via landing area is provided to support an interconnection via of increased area for reduced resistance without increasing side-to-side capacitance between the source metal line and the drain metal line. Increasing the area of the via reduces the connection resistance to the source and/or drain. Providing an extended source metal line and/or drain metal line also allows a via landing area to be moved farther in the first direction to reduce via to via capacitance. In some examples, one of the source metal line and drain metal line extends farther in the first direction, and the other one of the drain metal line and the source metal line extends farther in an opposite direction to reduce interconnection resistance. In some examples, the source metal line and the drain metal line are formed in a same metal layer with different metallization patterns.

Before discussing examples of ICs in which at least one of a source metal line and a drain metal line of a transistor extends farther in a direction than the other metal line to increase a via landing area for reduced interconnection resistance starting at FIG. 2, a conventional IC 100 is first described with reference to FIGS. 1A-1C.

Figure 1A:
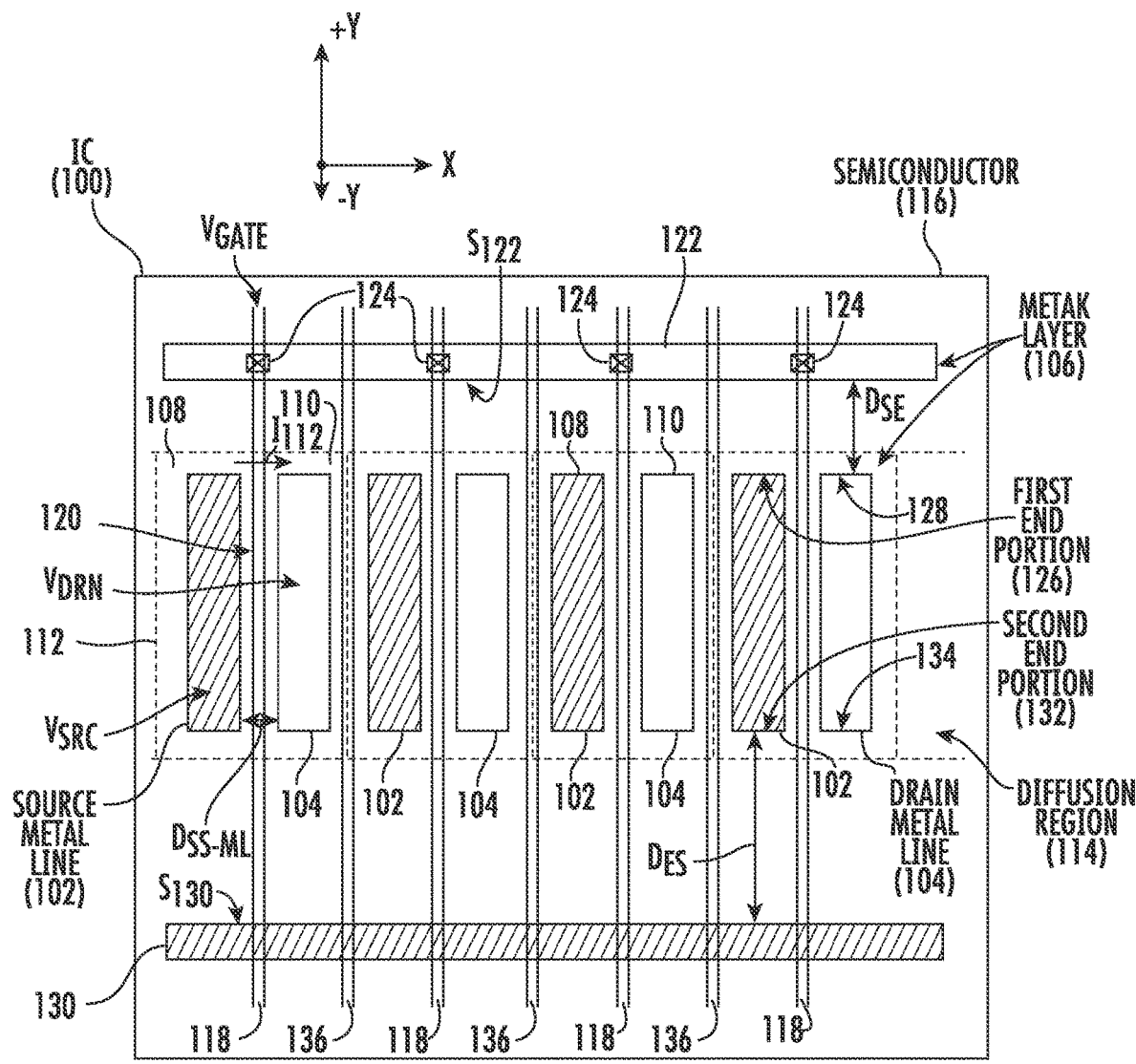
FIG. 1A is an illustration of a top view of an integrated circuit (IC), including source and drain metal lines in a metal layer coupled to sources and drains of transistors in a diffusion region of a semiconductor.

FIG. 1A is an illustration of a top view of an IC 100, including source metal lines 102 and drain metal lines 104 in a metal layer 106. The top view in FIG. 1A is provided to show features of the metal layer 106. The source metal lines 102 and drain metal lines 104 each provide a connection to a source 108 and a drain 110, respectively, of a transistor 112 in a diffusion region 114 of a semiconductor 116. The source metal lines 102 and the drain metal lines 104 are portions of metal interconnects that may connect the transistors 112 to each other and/or to an external circuit (not shown). The diffusion region 114 may include additional transistors 112 not shown in FIG. 1A, and the semiconductor 116 may include additional diffusion regions 114.

To increase the number of transistors 112 that will fit within the IC 100, the dimensions of transistors 112 and metal features of metal interconnects, including the source metal lines 102 and the drain metal lines 104, are reduced with each generation of technology. However, such reductions are limited by the physical limitations of the technology. For example, the metal layer 106, including the source metal lines 102 and the drain metal lines 104, may be formed in a photolithographic process using metallization patterns, as known in the art. Due to limitations of this method, including optical limitations, there are limits to how small the dimensions of metal features can be reliably formed with a metallization pattern. Those dimensions may include a minimum width of a metal feature (e.g., metal line) as well as a minimum allowed spacing or separation distance between metal features. One example of such minimum spacing limitations is a side-to-side distance $D_{SS-ML}$ of the source metal line 102 and drain metal line 104. One technique used to overcome the limitations of a metallization pattern is to use a first metallization pattern to form some of the features in the metal layer 106 and a second metallization pattern to form other features in the metal layer 106. Features formed by a different metallization pattern are not subject to the same minimum distances as features in the same metallization pattern. Using a different metallization pattern, features can be located closer together than the minimum allowed separation distances of a single metallization pattern. Other examples of spacing limitations are discussed below in the detailed description of features of the IC 100 in FIG. 1A.

As noted above, each of the transistors 112 includes one of the sources 108 and one of the drains 110, which are portions of the diffusion region 114 extending in a +Y-axis (positive Y-axis) direction across the diffusion region 114. Each of the transistors 112 also includes a gate 118 disposed on the diffusion region 114. The gates 118 also extend in the +Y-axis direction between the source 108 and the drain 110 over a channel 120 in the diffusion region 114. A gate voltage $V_{GATE}$ is provided to the gate 118 to control whether current $I_{112}$ will flow in the channel 120. The current $I_{112}$ is based on a source voltage $V_{SRC}$ provided to the source 108 by metal interconnects, including the source metal line 102. A drain voltage $V_{DRN}$ is provided to the drain metal line 104 by metal interconnects, including the drain metal line 104. The gate voltage $V_{GATE}$ is provided to the gate 118 by a gate metal line 122. The gate metal line 122 extends in the X-axis direction in FIG. 1A and may be coupled to each of the gates 118, as explained below. The gate metal line 122 may also be in the metal layer 106 and coupled to the gates 118 by vias 124.

The gate metal line 122 may be formed in a same metallization pattern as the source metal lines 102 and/or the drain metal lines 104. In FIG. 1A, the gate metal line 122 is formed in a same metallization pattern as the drain metal line 104. Consequently, there is a minimum allowed side-to-end spacing distance $D_{SE}$ allowed in the +Y-axis direction between a side $S_{122}$ of the gate metal line 122 and a first end portion 128 of the drain metal lines 104. In FIG. 1A, the source metal lines 102 may be formed by the same metallization pattern as the drain metal lines 104 and the gate metal lines 122 with at least the minimum side-to-side spacing distance $D_{SS-ML}$ between the source metal lines 102 and the drain metal lines 104 and at least the minimum side-to-end spacing $D_{SE}$ from the side S22 of the gate metal line 122 to a first end portion 126 of the source metal lines 102. Alternatively, one of the source metal lines 102 or the drain metal lines 104 may be formed in a separate metallization pattern.

As shown in FIG. 1A, the gates 118 of all the transistors 112 are coupled to the gate metal line 122. Thus, the transistors 112 in FIG. 1A are controlled by the gate voltage $V_{GATE}$ to provide respective currents $I_{112}$ in parallel. This may be done, for example, to provide greater drive strength than can be driven by one of the transistors 112 due to their small size. The IC 100 also includes additional metal lines, such as a signal metal line 130, which may be coupled to at least one of the source metal lines 102 and the drain metal lines 104 to provide the source voltage $V_{SRC}$ or the drain voltage $V_{DRN}$. A side $S_{130}$ of the signal metal line 130 is spaced an end-to-side distance $D_{ES}$ from a second end portion 132 of the source metal lines 102 and a second end portion 134 of the drain metal lines 104. The IC 100 also includes alternate gates 136 between transistors. The alternate gates 136 may be inactive, non-conductive features (e.g., dummy gates). In some examples, the alternate gates 136 may be used to interconnect transistors on the IC 100.

In some examples, the alternate gates 136 may be additional gates 118 to control channels on each side of the drain metal lines 104 and/or the source metal lines 102. In such examples, the additional gates 118 are coupled to the gate metal lines 122 by vias 124. It should also be noted, in this regard, that each of the sources 108 and the drains 110 may function as either a source or a drain of the transistors 112, depending on a polarity of a voltage applied between the sources 108 and the drain 110.

FIG. 1B is an illustration of a top view of the source metal line 102 and the drain metal line 104 of one of the transistors 112 in FIG. 1A. FIG. 1B also includes the gates 118, the gate metal line 122, and the signal metal line 130. FIG. 1B is provided to show via landing areas 140 for vias 142 disposed on a top surface 144 of the source metal lines 102 and the drain metal lines 104. Here, the via landing areas 140 on the source metal lines 102 are a same size as the via landing areas 140 on the drain metal lines 104. A via landing area $A_{140}$ indicates a cross-sectional area of a via landing area 140 that couples the metal layer 106 to a higher level of metal (not shown). For example, the metal layer 106 may be a first metal layer M1, and the vias 142 may be coupled to second metal layer M2 or higher metal layers (e.g., M3 or M4). A resistance of the via landing area 140 is inversely proportional to the cross-sectional via landing area $A_{140}$. Thus, increasing the cross-sectional via landing area $A_{140}$ of the via 142 would reduce resistance in the metal interconnect to the transistor 112. Reducing resistance in the metal interconnects to the transistors 112 reduces power consumption and can improve circuit performance. However, there are limitations on via formation, which may include a via-to-via separation distance in the +Y-axis direction, which may limit a number of vias used, and/or a limitation on side to side via overlap to minimize via-to-via capacitance.

FIG. 1C is another illustration of a top view of the source metal line 102 and the drain metal line 104 of the transistor 112 in FIG. 1B. FIG. 1C is provided to show via landing areas 150 for vias 152 disposed on a bottom surface 154 of the source metal lines 102 and the drain metal lines 104. The via landing areas 150 on the source metal lines 102 are a same size as the via landing areas 150 on the drain metal lines 104. A cross-sectional via landing area $A_{150}$ of a via landing area 150 is a cross-sectional area of a via (not shown) that couples the metal layer 106 to a lower level of metal or to the diffusion region 114. For example, the via landing areas 150 indicate a cross-sectional via landing area $A_{150}$ of a via 152 coupling the source metal lines 102 to the sources 108 and coupling the drain metal lines 104 to the drain 110.

In addition to showing the via landing areas 140, 150, FIGS. 1B and 1C are also provided to show that the vias 142, 152 on the source metal lines 102 are opposite to the vias 142, 152 on the drain metal lines 104 (i.e., on opposite sides of the gate 118). Capacitance between metal interconnects can increase delay of the transistors 112. Metal interconnects to the transistors 112 include the source metal lines 102, the drain metal lines 104, and the vias 142, 152. Thus, capacitance between such features can harm performance of a circuit, including the transistor 112.

Specifically, there is a capacitance C1 between the source metal line 102 and the drain metal line 104, depending on the side-to-side distance D1. The capacitance C1 also depends on a length L1 for which the source metal line 102 and the drain metal line 104 are opposite to each other. The source metal lines 102 in FIGS. 1A-1C are the same length as the drain metal lines 104, and they are opposite to each other over their entire length. Thus, the length of the source metal line 102 is the length L1 that generates the capacitance C1.

There is also capacitance C2 between the vias 142 on the top surfaces 144 of the source metal line 102 and the drain metal line 104, and capacitance C3 between the vias 152 on the bottom surfaces 154 of the source metal line 102 and the drain metal line 104. The capacitances C2 depend on a length L2 over which the vias 142 are parallel to each other and a distance D2 between them. The capacitances C3 depend on length L3 over which the vias 152 are parallel to each other and a distance D3 between them.

Another example of the manufacturing limitations that may be imposed on metal features in a single metallization pattern is a via-to-via distance $D_{142}$ in the +Y-axis direction between the vias 142 in FIG. 1B and a distance $D_{152}$ in the +Y-axis direction between the vias 152 in FIG. 1C. The distances $D_{142}$ and $D_{152}$ limit a number of vias 142, 152 that can be coupled to the source metal lines 102 and the drain metal lines 104 in the length L1. One way to reduce resistance between the source 108 and the source metal line 102, for example, would be to increase the area of vias 152, such as by increasing the number of vias 152. An alternative to increasing the number of vias 152 would be to increase a cross-sectional area of existing vias 152. However, both of these methods are limited by the distance $D_{152}$ between vias 152, as well as the distances from the vias 152 to the first end portions 126, 128 and from the via 152 to the second end portions 132, 134 of the source metal lines 102 and the drain metal lines 104, which all must fit within the length L1.

Figure 2:
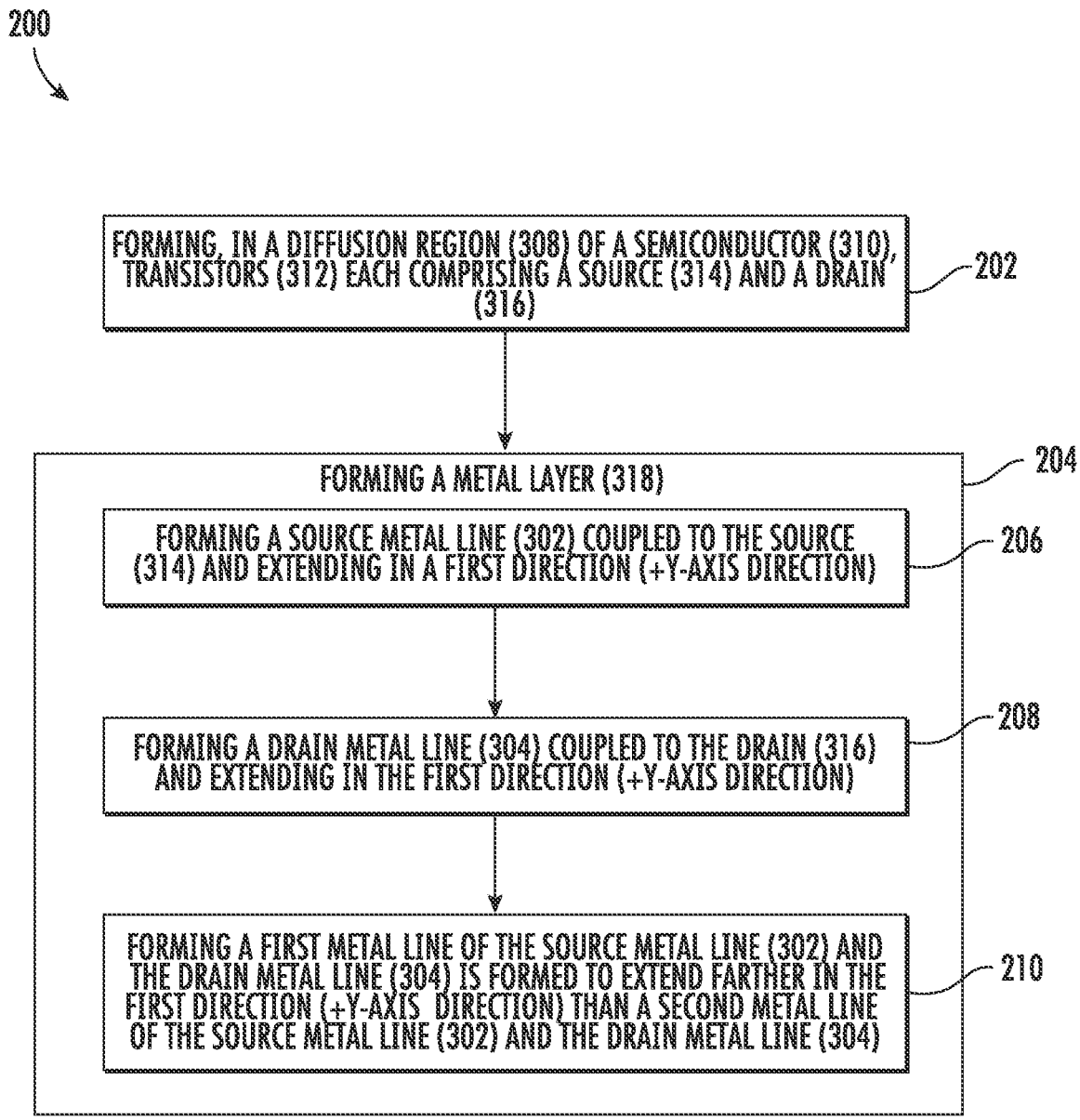
FIG. 2 is a flowchart of an exemplary method of fabricating an IC, including one of a source metal line and a drain metal line extending farther in a direction to increase a via landing area for reduced interconnection resistance.

FIG. 2 is a flowchart of an exemplary method 200 of fabricating an exemplary IC 300 in FIGS. 3A-3C, which includes one of a source metal line 302 and a drain metal line 304 extending farther in a +Y-axis direction to increase a via landing area 306 (FIGS. 3B and 3C) for reduced interconnection resistance without increasing side-to-side capacitance $C_{SS\text{-}ML}$ between the source metal line 302 and the drain metal line 304. The method 200 comprises forming, in a diffusion region 308 of a semiconductor 310, transistors 312 each comprising a source 314 and a drain 316 (block 202) and forming a metal layer 318 comprising (block 204) forming a source metal line 302 coupled to the source 314 and extending in a first direction (+Y-axis direction) (block 206) and forming a drain metal line 304 coupled to the drain 316 and extending in the first direction (+Y-axis direction) (block 208). In the method 200, forming a first metal line of the source metal line 302 and the drain metal line 304 to extend farther in the first direction (+Y-axis direction) than a second metal line of the source metal line 302 and the drain metal line 304 (block 210).

FIG. 3A is an illustration of a top view of the exemplary IC 300 in which a first one (e.g., a first metal line) of the source metal line 302 and the drain metal line 304 of a transistor 312 extends farther in a first direction (e.g., the +Y-axis direction) than a second one (e.g., second metal line) of the source metal line 302 and the drain metal line 304. Extending a first metal line in this manner provides additional length in the +Y-axis direction over which to increase the via landing area 306 (see FIG. 3B) for reduced interconnection resistance while still maintaining a minimum via-to-via distance limitation. Since the drain metal line 304 is not similarly extended in the +Y-axis direction to correspond to the source metal line 302, the side-to-side capacitance $C_{SS\text{-}ML}$ between the source metal line 302 and the drain metal line 304 is not increased. It is noted that various terms used herein for a minimum distance allowed for a metallization pattern may include minimum separation distance and minimum spacing distance, among other variations that refer to design rules used in fabrication of features of a metal layer with a metallization pattern.

The source 314 and the drain 316 are disposed in the diffusion region 308. The diffusion region 308 is a region of the semiconductor 310 (e.g., silicon) doped with at least one of N-type dopants and P-type dopants (i.e., pentavalent or trivalent materials). The source metal line 302 is coupled to the source 314 and extends in a first direction, which is the +Y-axis direction of FIG. 3A. The drain metal line 304 is coupled to the drain 316 and also extends in the first direction. Each of the transistors 312 in the IC 300 includes a gate 324 disposed on the diffusion region 308 between the source metal line 302 and the drain metal line 304. The IC 300 also includes a gate metal line 326 extending in a second direction, which is the X-axis direction in the example in FIG. 1A. The gate metal line 326 is coupled to gates 324 of the transistors 312 by vias 327. A voltage $V_{GATE}$ on the gate metal line 326 is provided to each of the gates 324 to activate the transistors 312. In this way, the transistors 312 in this example are coupled in parallel to provide a greater drive current capability. However, the IC 300 is just one example, and the exemplary aspects disclosed herein are not limited to ICs in which multiple transistors 312 are coupled in parallel. Additionally, the IC 300 includes alternate gates 325, which may be inactive, non-conductive features (e.g., dummy gates). In some examples, the alternate gates 325 may be used to interconnect transistors on the IC 300. In some examples, the alternate gates 325 may be additional gates 324 to control current flow on each side of the drain metal lines 304 and/or the source metal lines 302. In such examples, the alternate gates 325 are coupled to the gate metal lines 326 by additional vias 327 (not shown). Persons of skill in the art should recognize that the sources 314 and the drains 316 are portions of the diffusion region 308 that may function as a source 314 under a first voltage and as a drain 316 under a second voltage applied to one of the transistors 312.

Since the source metal lines 302 extend in the first direction (e.g., +Y-axis direction) and the gate metal line 326 extends in the second (X-axis) direction, the source metal lines 302 are orthogonal to the gate metal line 326 in this example. Therefore, each of the source metal lines 302 includes a first end portion 328 that is proximal to (i.e., situated near to) the gate metal line 326 and a second end portion 330 that is distal to (i.e., situated away from) the gate metal line 326. Similarly, each of the drain metal lines 304 includes a first end portion 332 proximal to the gate metal line 326 and a second end portion 334 distal to the gate metal line 326. In the example in FIG. 3A, the first end portions 328 of the source metal lines 302 extend farther in the +Y-axis direction than the first end portions 332 of the drain metal lines 304. Stated differently, a source metal to gate metal distance $D_{SG}$ between the first end portions 328 of the source metal line 302 and the gate metal line 326 is less than a drain metal to gate metal distance $D_{DG}$ between the first end portions 332 of the drain metal lines 304 and the gate metal line 326.

In the example in FIG. 3A, the source metal lines 302 are closer than the drain metal lines 304 to the gate metal line 326, but in an alternative example of the aspects disclosed herein, the first end portions 332 of the drain metal lines 304 could be farther in the +Y-axis direction than the first end portions 328 of the source metal lines 302. Thus, in the IC 300, a first metal line is the one of the source metal line 302, and the drain metal line 304 that extends farther in the first direction than a second metal line, which is the other one of the source metal line 302 and the drain metal line 304. In the example in FIG. 3A, the first metal line is the source metal line 302. The IC 300 also includes a signal metal line 336 (shown in each of FIGS. 3A-3C for reference) extending in the second direction (e.g., X-axis direction), which may be coupled to one of the source metal line 302 or the drain metal line 304 of the transistors 312. The signal metal line 336 is at least a minimum separation distance in the +Y-axis direction from the second end portions 330 and the second end portions 334.

In some examples of the IC 300 in FIG. 3A, the drain metal to gate metal distance $D_{DG}$ may be a minimum separation distance allowed in a metallization pattern between the first end portion 332 of the drain metal lines 304 and a side S326 of the gate metal line 326. As previously noted, the source metal to gate metal distance $D_{SG}$ in FIG. 3A is less than the drain metal to gate metal distance $D_{DG}$. Thus, in such examples, the source metal line 302 may not be formed in a same metallization pattern as the drain metal line 304. In the examples, the drain metal line 304 and the gate metal line 326 may be formed in a first metallization pattern for forming the metal layer 318, and the source metal line 302 is formed in a second metallization pattern for forming the metal layer 318 to avoid the minimum dimensional limitations of a metallization pattern, which will allow the source metal lines 302 to extend farther in the first direction. The extent to which the first end portions 328 of the source metal lines 302 are extended in the +Y-axis direction may be limited based on capacitance considerations between the source metal line 302 and the gate metal line 326.

FIGS. 3B and 3C are provided to illustrate that extending the source metal line 302 allows changes to vias above and below the source metal line 302. FIG. 3B is an illustration of a top view of the source metal line 302 and the drain metal line 304 of one of the transistors 312 in the IC 300 in FIG. 3A. FIG. 3B shows the via landing area 306 on a top surface 342 of the source metal line 302. The via landing area 306 can be increased in length in the first direction to increase a cross-sectional area $A_{344}$ of a via 344 disposed on the top surface 342. In this manner, resistance of the via 344 is reduced. In addition, it can be seen in FIG. 3B that the via landing areas 306 are shifted in the first direction to not be directly opposite to vias 346 on the drain metal line 304. As a result of shifting the via landing areas 306, capacitance between the vias 344 and the vias 346 is reduced. It should be noted again that while this example shows the source metal line 302 extended in the +Y-axis direction to reduce resistance in a connection to the source 314, as an alternative, the drain metal line 304, and not the source metal line 302, could be extended in the +Y-axis direction, in the same manner, to reduce resistance in the connection to the drain 316. In another alternative, a first one of the source metal line 302 and the drain metal line 304 could be extended in the −Y-axis direction, as shown below.

FIG. 3C is an illustration of a top view of the source metal line 302 and the drain metal line 304 of the transistor 312 in FIG. 3B. FIG. 3C shows via landing areas 348 for vias 350 on a bottom surface 352 of the extended source metal line 302. Vias 354 couple the drain metal line 304 to the drain 316. In FIG. 3C, the vias 350 coupled to the source 314 are shifted in the +Y-axis direction away from the vias 354 coupled to the drain 316 to reduce via-to-via capacitance while still maintaining a minimum via-to-via spacing limitation. Here, the vias 350 coupled to the source 314 could also be increased in size to reduce resistance but are not resized in this example.

FIG. 4 is an illustration of a top view of an exemplary IC 400 in which source metal lines 402(1)-402(4) of transistors 406 extend farther in a first direction (e.g., +Y-axis direction) than drain metal lines 404(1)-404(4) by different distances to increase sizes of via landing areas (not shown) to reduce resistance and to shift the via landing areas to reduce via-to-via capacitance. In other aspects, the IC 400 corresponds to the IC 300 in FIGS. 3A-3C. In FIG. 4, the source metal line 402(1), the source metal line 402(2), and the source metal line 402(4) each has smaller separation distance $D_{408}(1)$, $D_{408}(2)$, $D_{408}(4)$ between a first end portion 408 of the source metal line 402 and a gate metal line 410 than a separation distance $D_{412}$ between the gate metal line 410 and a first end portion 412 of the corresponding drain metal lines 404(1), 404(2), and 404(4). As shown, the source metal line 402(2) extends farther than the drain metal line 404(2) in the +Y-axis direction, but not as far as the source metal lines 402(1) and 402(4). Therefore, vias coupled to the source metal line 402(2) may be larger in area than the vias coupled to the source metal line 402(3) but not as large as the vias coupled to the source metal lines 402(1) and 402(4). In this regard, it may be determined that an intermediate reduction in resistance or capacitance in a metal interconnect coupled to the source metal line 402(2) is sufficient to meet requirements. In another example, any of the source metal lines 402(1)-402(4) may extend any desired distances farther than the drain metal lines 404(1)-404(4). In an alternative example, on or more of the drain metal lines 404(1)-404(4) may extend farther in the first direction than the source metal lines 402(1)-402(4) by different distances to reduce resistance or capacitance. In the example in FIG. 4, each of the source metal lines 402(1)-402(4) and the drain metal lines 404(1)-404(4) is a same distance $D_{414}$ from a signal metal line 414.

FIG. 5A is an illustration of a top view of an exemplary IC 500 in which a first one of drain metal lines 502 and source metal lines 504 of transistors 506 extend farther in a first direction (e.g., −Y-axis (negative Y-axis) direction) to provide more distance in which to increase a length $L_{VIA}$ of a via landing area 508 (see FIGS. 5B and 5C) and shift the via landing area 508 of at least one via 510 to reduce capacitance. The drain metal lines 502 and the source metal lines 504 extend in the first direction on opposite sides of gates 512. FIG. 5A is provided to show that a first metal line of the drain metal line 502 and the source metal line 504 may be extended in a direction away from a gate metal line 514 to achieve a reduction in resistance in vias 510 and to shift the via landing area 508 in a direction away from the gate metal line 514 to reduce capacitance with vias 510 on a second metal line (i.e., the second one of the drain metal line 502 and the source metal line 504). In this example, the drain metal lines 502 are extended beyond the source metal lines 504 to avoid increasing capacitance between the source metal lines 504 and the drain metal lines 502. In FIG. 5A, the source metal line 504 is a distance $D_{504}$ from a signal metal line 516 in the first direction. In some examples, the distance $D_{504}$ is a minimum allowed separation distance. In some examples, the drain metal lines 502 may be extended to have a smaller spacing distance $D_{502}$ from the signal metal line 516, and the distance $D_{502}$ may be smaller than a minimum allowed spacing distance. Thus, the drain metal lines 502 may be formed in a different metallization pattern than the source metal lines 504 and the signal metal line 516. In other aspects, the IC 500 may correspond to the ICs 300 and 400 in FIGS. 3A-4.

FIGS. 5B and 5C each show one of the transistors 506 in FIG. 5A, including a drain metal line 502 and a source metal line 504 on opposite sides of the gate 512 coupled to the gate metal line 514. One of the drain metal line 502 and the source metal line 504 may be coupled to the signal metal line 516. FIG. 5B illustrates vias 510 on a top surface 518 of the drain metal lines 502 and the source metal lines 504. The vias 510 on the drain metal lines 502 have increased via landing area $A_{510}$, made possible by extending the drain metal lines 502. The increased via landing area $A_{510}$ reduces resistance in the vias 510 while maintaining a minimum via-to-via distance $D_{510}$. The vias 510 on the drain metal line 502 are also shifted in the first direction to reduce capacitance with the vias 510 on the source metal line 504. FIG. 5C shows vias 522 coupled to a bottom surface 524 of the drain metal line 502 and the source metal line 504. The vias 522 coupled to the drain metal line 502 are also shifted in the first direction to reduce via-to-via capacitance with the vias 522 coupled to the source metal line 504. In addition, shifting both the vias 510 and the vias 522 in the first direction to align the vias 522 between the vias 510 and the drain 526 can provide a straight vertical path from the drain 526 through the via 522, the drain metal line 502, and the via 510 up to a higher metal layer, which reduces the resistance of a metal interconnect to the drain 526.

FIG. 6 is an illustration of a top view of an exemplary IC 600 in which drain metal lines 602(1)-602(4) of transistors 604 extend farther in a first direction than source metal lines 606(1)-606(4) by different distances to increase via landing area size and via cross-sectional area. Here, the drain metal lines 602(1)-602(4) and the source metal lines 606(1)-606(4) are a same distance $D_{608}$ from a gate metal line 608 and varying distances $D_{608}(1)$-$D_{608}(4)$ from a signal metal line 610. The amount by which the drain metal lines 602 are extended determines an amount by which vias can be shifted and an amount by which the via landing areas can be extended. The drain metal lines 602(1) and 602(4) are extended to a greater degree than the drain metal line 602(2). Therefore, vias to the drain metal lines 602(1) and 602(4) may have less resistance than vias to the drain metal line 602(2), which have less resistance than vias to the drain metal line 602(3). As discussed above, shifting vias also provides a reduction in capacitance.

FIG. 7 is an illustration of a top view of an exemplary IC 700 in which drain metal lines 702 of transistors 704 extend farther in a first direction than the source metal lines 706 of the transistors 704 and the source metal lines 706 extend farther in a second direction than the drain metal lines 702 to increase the sizes of via landing areas to reduce resistance without increasing capacitance and to shift the via landing areas in the respective directions to reduce via-to-via capacitance. In this example, metal interconnect resistance can be reduced to both the drain metal lines 702 and the source metal lines 706, and the extending of the source metal lines 706 and the drain metal lines 702 can be adjusted in each transistor to achieve different levels of reduction in resistance and capacitance. Although the transistors 704 in FIG. 7 are coupled in parallel to a gate metal line 710, the transistors 704 are not limited in this regard as the gate metal line 710 shown in FIG. 7 may be segmented such that each of the transistors 704 is activated individually by respective gate voltage $V_{GATE}$. Any of the source metal lines 706 or drain metal lines 702 may be coupled to a signal metal line 712.

FIG. 8 illustrates an exemplary wireless communications device 800 that includes RF components formed from one or more ICs 802 and can include an exemplary IC in which at least one of a source metal line and a drain metal line of a transistor extends farther in a direction than the other metal line to increase a via landing area for reduced interconnection resistance, including the ICs in FIGS. 3A-7, and according to any of the aspects disclosed herein. The wireless communications device 800 may include or be provided in any of the above-referenced devices as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RFICs, mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into the I and Q analog output signals, e.g., I and Q output currents, for further processing.

Within the transmitter 808, lowpass filters 814(1), 814(2) filter the I and Q analog output signals, respectively, to remove undesired signals caused by the prior digital-to-analog conversion. The lowpass filters 814(1), 814(2) may be implemented as AW filter packages 803. Amplifiers (AMPs) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals from a TX LO signal generator 822 through mixers 820(1), 820(2) to provide an upconverted signal 824. A filter 826 filters the upconverted signal 824 to remove undesired signals caused by the frequency upconversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832. Any of the lowpass filters 814(1) and 814(2), or the filter 826, may be an acoustic wave filter (AW filter) packages 803.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Downconversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by AMPs 842(1), 842(2) and further filtered by lowpass filters 844(1), 844(2) to obtain I and Q analog input signals, which are provided to the data processor 806. Any of the filter 836 and the lowpass filters 844(1), 844(2) may be AW filter packages 803. In this example, the data processor 806 includes analog-to-digital converters (ADCs) 846(1), 846(2) for converting the analog input signals into digital signals to be further processed by the data processor 806.

In the wireless communications device 800 of FIG. 8, the TX LO signal generator 822 generates the I and Q TX LO signals used for frequency upconversion, while the RX LO signal generator 840 generates the I and Q RX LO signals used for frequency downconversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Wireless communications devices 800 that can each include an exemplary IC in which at least one of a source metal line and a drain metal line of a transistor extends farther in a direction than the other metal line to increase a via landing area for reduced interconnection resistance, including the ICs in FIGS. 3A-7, and according to any of the aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

FIG. 9 illustrates an example of a processor-based system 900 including circuits including an exemplary IC in which at least one of a source metal line and a drain metal line of a transistor extends farther in a direction than the other metal line to increase a via landing area for reduced interconnection resistance, including the ICs in FIGS. 3A-7, and according to any aspects disclosed herein. In this example, the processor-based system 900 includes one or more central processor units (CPUs) 902, which may also be referred to as CPU or processor cores, each including one or more processors 904. The CPU(s) 902 may have cache memory 906 coupled to the processor(s) 904 for rapid access to temporarily stored data. The CPU(s) 902 is coupled to a system bus 908 and can intercouple master and slave devices included in the processor-based system 900. As is well known, the CPU(s) 902 communicates with these other devices by exchanging address, control, and data information over the system bus 908. For example, the CPU(s) 902 can communicate bus transaction requests to a memory controller 910 as an example of a slave device. Although not illustrated in FIG. 9, multiple system buses 908 could be provided; wherein each system bus 908 constitutes a different fabric.

Other master and slave devices can be connected to the system bus 908. As illustrated in FIG. 9, these devices can include a memory system 912 that includes the memory controller 910 and one or more memory arrays 914, one or more input devices 916, one or more output devices 918, one or more network interface devices 920, and one or more display controllers 922, as examples. The input device(s) 916 can include any type of input device, including, but not limited to, input keys, switches, voice processors, etc. The output device(s) 918 can include any type of output device, including, but not limited to, audio, video, other visual indicators, etc. The network interface device(s) 920 can be any device configured to allow an exchange of data to and from a network 924. The network 924 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 920 can be configured to support any type of communications protocol desired.

The CPU(s) 902 may also be configured to access the display controller(s) 922 over the system bus 908 to control information sent to one or more displays 926. The display controller(s) 922 sends information to the display(s) 926 to be displayed via one or more video processors 928, which process the information to be displayed into a format suitable for the display(s) 926. The display(s) 926 can include any type of display, including, but not limited to, a cathode ray tube (CRT), a liquid crystal display (LCD), a plasma display, a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in several different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. An integrated circuit, comprising:
    a semiconductor comprising a diffusion region;
    a transistor comprising a source and a drain each disposed in the diffusion region; and
    a metal layer comprising:
        a source metal line coupled to the source and extending in a first direction; and
        a drain metal line coupled to the drain and extending in the first direction,
    wherein:
        a first metal line of the source metal line and the drain metal line extends farther in the first direction than a second metal line of the source metal line and the drain metal line.

2. The integrated circuit of clause 1, wherein:
    the transistor further comprises a gate disposed on the diffusion region between the source metal line and the drain metal line, the gate extending in the first direction; and
    the integrated circuit further comprises a gate metal line coupled to the gate, the gate metal line extending in a second direction;
    wherein each of the first metal line and the second metal line comprises:
        a first end portion proximal to the gate metal line; and
        a second end portion distal to the gate metal line.

3. The integrated circuit of clause 2, wherein:
    a first distance in the first direction between the first end portion of the first metal line and the gate metal line is less than a second distance in the first direction between the first end portion of the second metal line and the gate metal line.

4. The integrated circuit of clause 2, wherein:
    a first distance in the first direction between the first end portion of the first metal line and the gate metal line is the same as a second distance in the first direction between the first end portion of the second metal line and the gate metal line.

5. The integrated circuit of any of clause 2 to clause 4, further comprising:
    a first via disposed on a surface of the first metal line and adjacent to the first end portion of the first metal line; and
    a second via disposed on a surface of the second metal line and adjacent to the first end portion of the second metal line;
    wherein a first via landing area of the first via is longer in the first direction than a second via landing area of the second via in the first direction.

6. The integrated circuit of clause 5, wherein the first via landing area is closer than the second via landing area in the first direction to the gate metal line.

7. The integrated circuit of any of clause 3 to clause 6, further comprising a second source metal line and a second drain metal line disposed on opposite sides of a second gate extending in the first direction, the second gate coupled to the gate metal line, wherein:
    a first one of the second source metal line and the second drain metal line extends farther in the first direction than a second one of the second source metal line and the second drain metal line; and
    a third distance between the first one of the second source metal line and the second drain metal line, and the gate metal line is less than the first distance.

8. The integrated circuit of any of clause 5 to clause 7, further comprising:
    a third via disposed on the surface of the first metal line and adjacent to the second end portion of the first metal line; and
    a fourth via disposed on the surface of the second metal line and adjacent to the second end portion of the second metal line,
    wherein a third via landing area is closer than a fourth via landing area in the first direction to the gate metal line.

9. The integrated circuit of any of clause 1 to clause 10 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor, a computer monitor; a television; a tuner; a radio; a satellite radio; a music player; a digital music player, a portable music player, a digital video player, a video player; a digital video disc (DVD) player, a portable digital video player, an automobile; a vehicle component; avionics systems; a drone; and a multicopter.

10. A method of fabricating an integrated circuit, the method comprising:
   forming, in a diffusion region of a semiconductor, a transistor comprising a source and a drain; and
   forming a metal layer comprising:
      forming a source metal line coupled to the source and extending in a first direction; and
      forming a drain metal line coupled to the drain and extending in the first direction,
      wherein:
         a first metal line of the source metal line and the drain metal line is formed to extend farther in the first direction than a second metal line of the source metal line and the drain metal line 11. The method of clause 10, further comprising:
   forming a gate on the diffusion region between the source metal line and the drain metal line, the gate extending in the first direction; and forming a gate metal line extending in a second direction;
   wherein each of the first metal line and the second metal line comprises:
      a first end portion proximal to the gate metal line; and
      a second end portion distal to the gate metal line.

12. The method of clause 11, wherein:
   the first end portion of the first metal line is a first distance from the gate metal line; and
   the first end portion of the second metal line is a second distance from the gate metal line,
   wherein the first distance is less than the second distance.

13. The method of clause 11, wherein:
   the first end portion of the first metal line is a first distance from the gate metal line; and
   the first end portion of the second metal line is a second distance from the gate metal line,
   wherein the first distance is the same as the second distance.

14. The method of any of clause 11 to clause 13, further comprising:
   forming a first via disposed on a surface of the first metal line and adjacent to the first end portion of the first metal line; and
   forming a second via disposed on a surface of the second metal line and adjacent to the first end portion of the second metal line;
   wherein a first via landing area of the first via is longer in the first direction than a second via landing area of the second via in the first direction.

15. The method of clause 14, further comprising forming the first via landing area closer than the second via landing area in the first direction to the gate metal line.

16. The method of any of clause 12 to clause 15, further comprising forming a second source metal line and a second drain metal line disposed on opposite sides of a second gate extending in the first direction, the second gate coupled to the gate metal line;
   wherein:
      a first one of the second source metal line and the second drain metal line extends farther in the first direction than a second one of the second source metal line and the second drain metal line; and
      a third distance between the gate metal line and the first one of the second source metal line and the second drain metal line is less than the first distance.

17. The method of any of clause 14 to clause 16, further comprising:
   forming a third via disposed on the surface of the first metal line and adjacent to the second end portion of the first metal line;
   forming a fourth via disposed on the surface of the second metal line and adjacent to the second end portion of the second metal line; and
   forming a third via landing area closer than a fourth via landing area in the first direction to the gate metal line.

18. The method of any of clause 11 to clause 17, where forming the metal layer further comprises:
   forming the second metal line and the gate metal line in a first metallization pattern; and
   forming the first metal line in a second metallization pattern.

19. A transistor circuit, comprising:
   a diffusion region;
   a source and a drain each disposed in the diffusion region; and
   a metal layer comprising:
      a source metal line coupled to the source and extending in a first direction; and
      a drain metal line coupled to the drain and extending in the first direction,
   wherein:
      a first metal line of the source metal line and the drain metal line extends farther in the first direction than a second metal line of the source metal line and the drain metal line.

What is claimed is:

1. An integrated circuit, comprising:
   a semiconductor comprising a diffusion region;
   a transistor comprising a source and a drain each disposed in the diffusion region;
   a metal layer comprising:
      a source metal line coupled to the source and extending in a first direction; and
      a drain metal line coupled to the drain and extending in the first direction;
   a gate disposed on the diffusion region between the source metal line and the drain metal line, the gate extending in the first direction; and
   a gate metal line coupled to the gate, the gate metal line extending across a width of the source metal line and the drain metal line along a second direction orthogonal to the first direction,
   wherein:
      a first metal line of the source metal line and the drain metal line extends farther in the first direction than a second metal line of the source metal line and the drain metal line; and
      each of the first metal line and the second metal line comprises:
         a first end face proximal to the gate metal line; and
         a second end face distal to the gate metal line.

2. The integrated circuit of claim 1, wherein:
   a first distance in the first direction between the first end face of the first metal line and the gate metal line is less than a second distance in the first direction between the first end face of the second metal line and the gate metal line.

3. The integrated circuit of claim 2, further comprising a second source metal line and a second drain metal line disposed on opposite sides of a second gate extending in the first direction, the second gate coupled to the gate metal line, wherein:
- a first one of the second source metal line and the second drain metal line extends farther in the first direction than a second one of the second source metal line and the second drain metal line; and
- a third distance between the first one of the second source metal line and the second drain metal line, and the gate metal line is less than the first distance.

4. The integrated circuit of claim 1, wherein:
a first distance in the first direction between the first end face of the first metal line and the gate metal line is the same as a second distance in the first direction between the first end face of the second metal line and the gate metal line.

5. The integrated circuit of claim 1, further comprising:
- a first via disposed on a surface of the first metal line and adjacent to the first end face of the first metal line; and
- a second via disposed on a surface of the second metal line and adjacent to the first end face of the second metal line;
- wherein a first via landing area of the first via is longer in the first direction than a second via landing area of the second via in the first direction.

6. The integrated circuit of claim 5, wherein the first via landing area is closer than the second via landing area in the first direction to the gate metal line.

7. The integrated circuit of claim 5, further comprising:
- a third via disposed on the surface of the first metal line and adjacent to the second end face of the first metal line; and
- a fourth via disposed on the surface of the second metal line and adjacent to the second end face of the second metal line,
- wherein a third via landing area is closer than a fourth via landing area in the first direction to the gate metal line.

8. The integrated circuit of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

9. A method of fabricating an integrated circuit, the method comprising:
- forming, in a diffusion region of a semiconductor, a transistor comprising a source and a drain;
- forming a metal layer comprising:
  - forming a source metal line coupled to the source and extending in a first direction; and
  - forming a drain metal line coupled to the drain and extending in the first direction;
  - forming a gate on the diffusion region between the source metal line and the drain metal line, the gate extending in the first direction; and
  - forming a gate metal line coupled to the gate and extending across a width of the source metal line and the drain metal line along a second direction orthogonal to the first direction,
- wherein:
  - a first metal line of the source metal line and the drain metal line is formed to extend farther in the first direction than a second metal line of the source metal line and the drain metal line; and
  - each of the first metal line and the second metal line comprises:
    - a first end face proximal to the gate metal line; and
    - a second end face distal to the gate metal line.

10. The method of claim 9, wherein:
the first end face of the first metal line is a first distance from the gate metal line; and
the first end face of the second metal line is a second distance from the gate metal line,
wherein the first distance is less than the second distance.

11. The method of claim 10, further comprising forming a second source metal line and a second drain metal line disposed on opposite sides of a second gate extending in the first direction, the second gate coupled to the gate metal line; wherein:
- a first one of the second source metal line and the second drain metal line extends farther in the first direction than a second one of the second source metal line and the second drain metal line; and
- a third distance between the gate metal line and the first one of the second source metal line and the second drain metal line is less than the first distance.

12. The method of claim 9, wherein:
the first end face of the first metal line is a first distance from the gate metal line; and
the first end face of the second metal line is a second distance from the gate metal line,
wherein the first distance is the same as the second distance.

13. The method of claim 9, further comprising:
- forming a first via disposed on a surface of the first metal line and adjacent to the first end face of the first metal line; and
- forming a second via disposed on a surface of the second metal line and adjacent to the first end face of the second metal line;
- wherein a first via landing area of the first via is longer in the first direction than a second via landing area of the second via in the first direction.

14. The method of claim 13, further comprising forming the first via landing area closer than the second via landing area in the first direction to the gate metal line.

15. The method of claim 13, further comprising:
- forming a third via disposed on the surface of the first metal line and adjacent to the second end face of the first metal line;
- forming a fourth via disposed on the surface of the second metal line and adjacent to the second end face of the second metal line; and
- forming a third via landing area closer than a fourth via landing area in the first direction to the gate metal line.

16. The method of claim 9, where wherein forming the metal layer further comprises:
- forming the second metal line and the gate metal line in a first metallization pattern; and
- forming the first metal line in a second metallization pattern.

17. A transistor circuit, comprising:
a diffusion region;
a source and a drain each disposed in the diffusion region;
a metal layer comprising:
- a source metal line coupled to the source and extending in a first direction; and
- a drain metal line coupled to the drain and extending in the first direction, a gate disposed on the diffusion region between the source metal line and the drain metal line, the gate extending in the first direction; and
a gate metal line coupled to the gate, the gate metal line extending across a width of the source metal line and the drain metal line along a second direction orthogonal to the first direction,
wherein:
- a first metal line of the source metal line and the drain metal line extends farther in the first direction than a second metal line of the source metal line and the drain metal line; and
- each of the first metal line and the second metal line comprises:
  - a first end face proximal to the gate metal line; and
  - a second end face distal to the gate metal line.

\* \* \* \* \*